United States Patent [19]

Uzuda et al.

[11] Patent Number: 4,882,622
[45] Date of Patent: Nov. 21, 1989

[54] SILHOUETTE CUTTING APPARATUS

[75] Inventors: Tetsuji Uzuda, Kawagoe; Takashi Kuramoto, Oomiya; Takeo Onga, Saitama; Teruo Suzuki, Kamifukuoka; Masaru Koizumi, Funabashi; Takeo Kondo, Tokyo, all of Japan

[73] Assignee: Toppan Printing Co., Ltd., Tokyo, Japan

[21] Appl. No.: 245,214

[22] Filed: Sep. 16, 1988

[30] Foreign Application Priority Data

Sep. 18, 1987 [JP] Japan .................. 62-234153
Sep. 18, 1987 [JP] Japan .................. 62-234154
Mar. 8, 1988 [JP] Japan .................. 63-29859[U]

[51] Int. Cl.[4] .......................... H04N 9/11; H04N 1/46
[52] U.S. Cl. ....................................... 358/80; 358/75; 358/22
[58] Field of Search ................ 358/75, 80, 22; 382/22

[56] References Cited

U.S. PATENT DOCUMENTS

| 4,408,868 | 10/1983 | Thomas et al. | 355/14 |
| 4,418,358 | 11/1983 | Poetsch et al. | 358/80 |
| 4,556,900 | 12/1985 | Willis | 358/23 |
| 4,597,006 | 6/1986 | Orsburn | 358/22 |
| 4,644,583 | 2/1987 | Watanabe et al. | 382/22 |
| 4,646,144 | 2/1987 | Ishida et al. | 358/75 |
| 4,692,796 | 9/1987 | Yamada et al. | 358/76 |
| 4,694,329 | 9/1987 | Belmares-Sarahia et al. | 358/80 |
| 4,740,833 | 4/1988 | Shiota et al. | 358/75 |
| 4,754,323 | 6/1988 | Kaji et al. | 358/44 |
| 4,811,084 | 3/1989 | Belmares-Sarahia et al. | 358/22 |

FOREIGN PATENT DOCUMENTS 2721339 11/1978 Fed. Rep. of Germany .
2162716716 2/1986 United Kingdom .

Primary Examiner—James J. Groody
Assistant Examiner—Kim Yen Vu
Attorney, Agent, or Firm—Bacon & Thomas

[57] ABSTRACT

A silhouette cutting apparatus includes a two-dimensional image scanner for reading a color separation film, a frame memory for storing a read image signal, a CRT display for displaying an image of any color separation film selectively output from the frame memory, a pointer for displaying a cross mark at one point in a desired figure in a displayed image, a latch for latching color or brightness of a displayed point of the cross mark, a comparator for comparing the data from the latch with color or brightness of all other points of image signals of any separation film selectively output from the frame memory and detecting silhouette image information of the desired figure in accordance with whether or not their difference exceeds a predetermined value, and a cutting plotter for cutting a peel-off film in accordance with the detected silhouette image information.

6 Claims, 6 Drawing Sheets

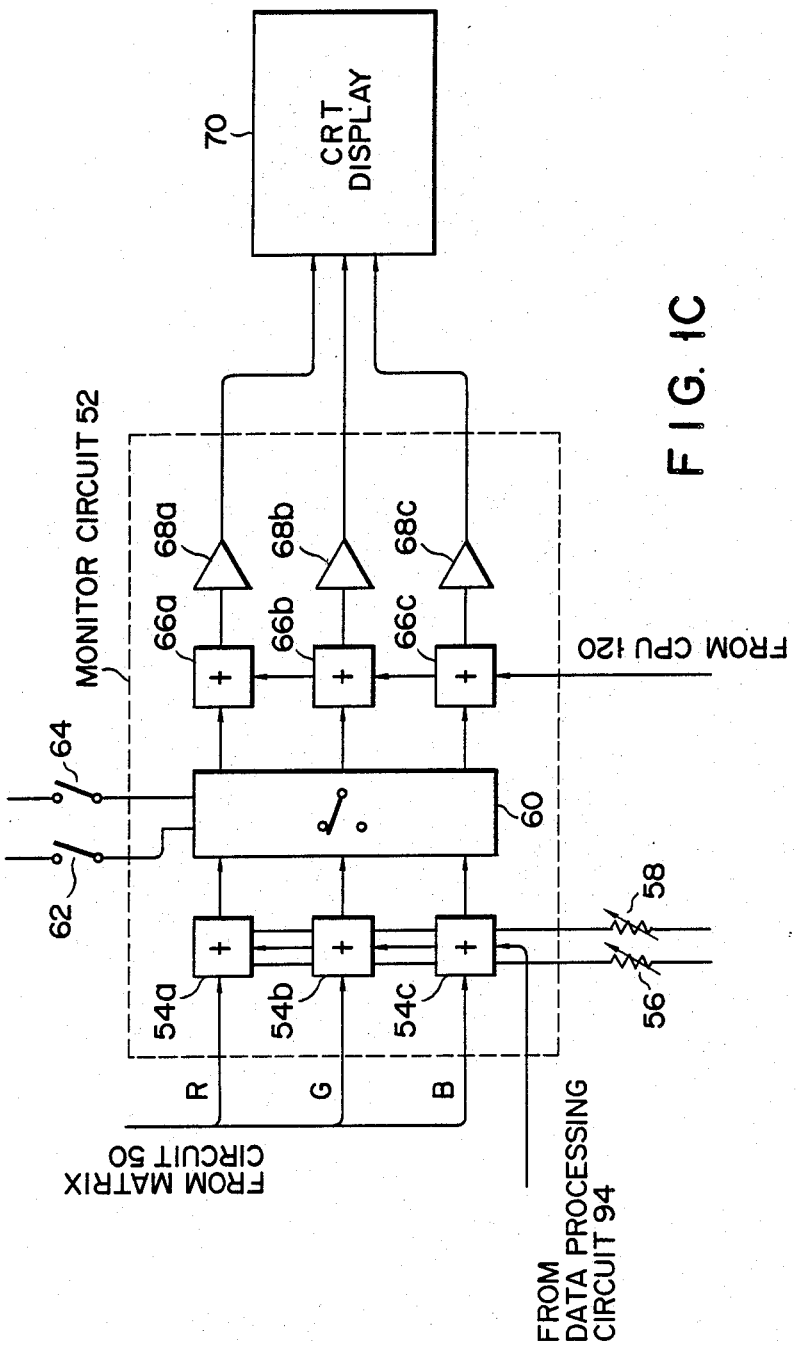

SILHOUETTE CUTTING APPARATUS

BACKGROUND OF THE INVENTION

1. Field of the Invention

The present invention relates to a silhouette cutting apparatus for cutting a peel-off film in correspondence with a silhouette of a necessary portion so as to form a mask in order to mask an unnecessary portion while leaving the necessary portion used for printing a color separation film in color printing and, more particularly, to a technique of detecting silhouette information of the necessary portion.

2. Description of the Related Art

When a color separation plate for color printing is formed, a color scanner is used. The color scanner photoelectrically reads a color original, separates image signals into color signals in units of color components, and exposes a color separation film accordingly. The film is developed to form a color separation plate.

The color scanner can designate an area of color separation in the color original. However, the designated area is limited to a rectangular range. For this reason, when only a person or commodity is printed like a leaflet without using an entire color original for printing and a background color is required to be white or a predetermined color, an unnecessary portion (background) of a color separation plate must be masked when a positive original plate for printing a press plate is formed from the color separation plate. In order to form the positive original plate for printing the press plate from the color separation plate, a photographic technique such as contact printing is adopted. In this technique, the color separation plate is locally shielded from printing light to achieve masking. For this purpose, a peel-off film prepared by adhering a red sheet on a transparent sheet is cut along a silhouette of a necessary portion.

The peel-off film from which the red sheet corresponding to the necessary portion is cut is overlaid on the color separation plate so as to form a positive original plate for printing the press plate, thus shielding the unnecessary portion.

Conventionally, the mask is formed by overlaying the peel-off film on the color separation plate and cutting it along the silhouette by a skilled person. However, this cutting requires considerably high precision and much time. In addition, satisfactory ones cannot often be obtained. If this mask is offset from the silhouette of an image, the silhouette of the image is indented or becomes large, or the image is deformed, resulting in poor appearance.

SUMMARY OF THE INVENTION

The present invention has been made in consideration of the above situation, and has as its object to provide a silhouette cutting apparatus which can detect a silhouette of an image of a necessary portion and can automatically form a mask accordingly so that an unnecessary portion of an image on a color separation plate can be accurately masked.

The silhouette cutting apparatus according to the present invention comprises an input section for reading a color separation plate and obtaining its image information, a display section for displaying the image information obtained by the input section, a pointer for designating one point of a desired figure of the displayed image, a detector for comparing brightness or color of the designated point and all other points of the displayed image to detect points of a boundary where the difference becomes higher than a predetermined value, thereby detecting silhouette image information of the desired figure, and an output section for forming a mask in accordance with the detected silhouette image information.

According to the silhouette cutting apparatus of the present invention, an image of a color separation plate is read and displayed, and an arbitrary point in a necessary figure to be left from masking of the color separation plate, and a predetermined value for determining a brightness or color difference of the necessary figure and its background are designated while observing the screen, so that silhouette image information of the necessary figure can be detected. If the desired silhouette is not detected, the arbitrary point and the predetermined value are changed. Thus, a mask can be automatically formed in accordance with the detection result.

BRIEF DESCRIPTION OF THE DRAWINGS

FIGS. 1A to 1E are block diagrams of an embodiment of a silhouette cutting apparatus according to the present invention.

DETAILED DESCRIPTION OF THE PREFERRED EMBODIMENT

An embodiment of a silhouette cutting apparatus according to the present invention will be described hereinafter with reference to the accompanying drawings.

FIGS. 1A to 1E are block diagrams of the silhouette cutting apparatus.

Figure 1A:
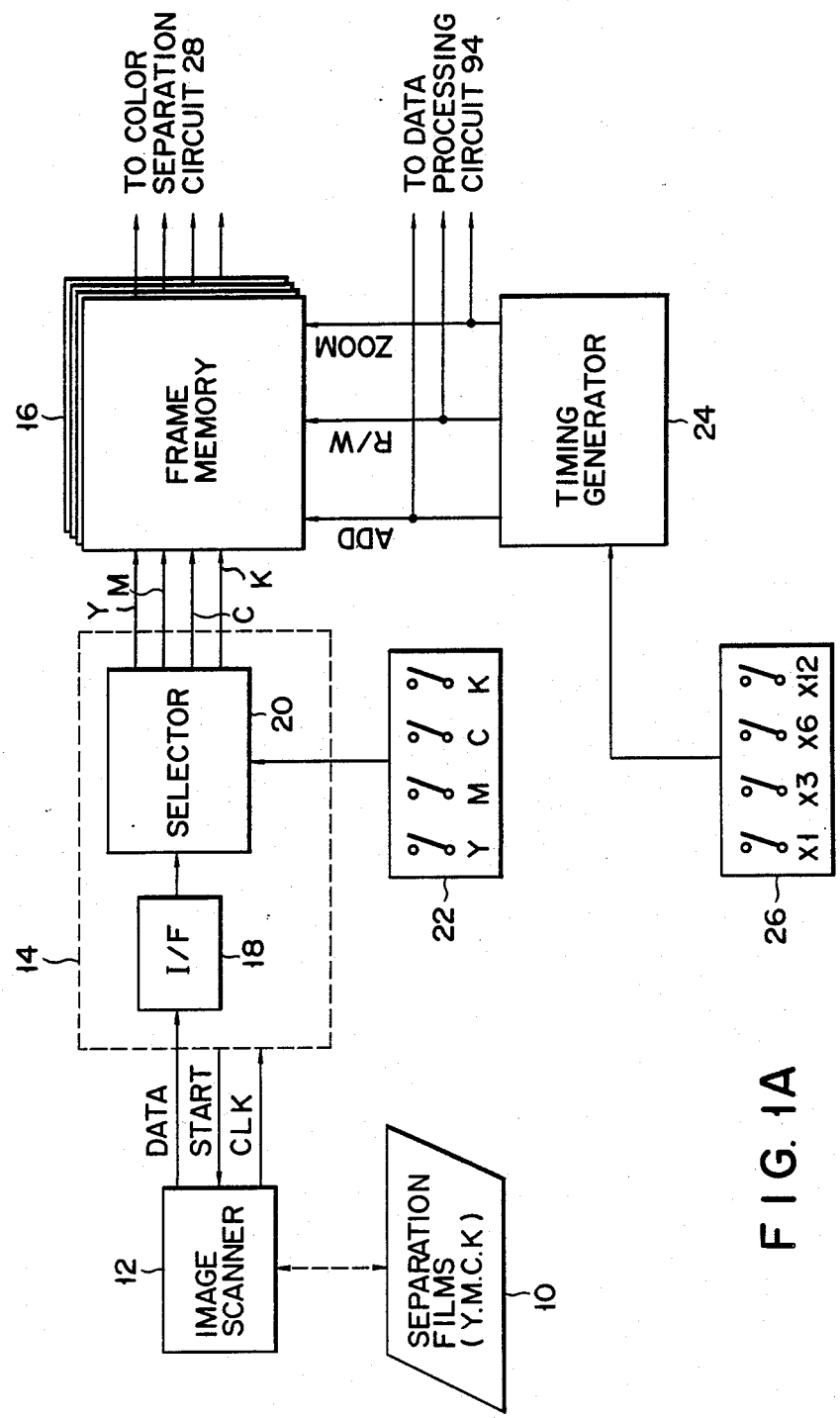

As shown in FIG. 1A, four, i.e., Y, M, C, and K color separation plates or films 10 are read by two-dimensional image scanner 12. The resolution of the scanner 12 is preferably set to 10 lines/mm. Note that since positive original plates for printing press plates are formed in units of several pages, one Mylar film (an assemble film corresponding to two, four, or eight pages of prints) on which various color separation films are laid out is read instead of reading color separation films 10 in units of originals. For this reason, two-dimensional image scanner 12 can cope with a very large assemble size, as will be described later with reference to FIG. 2.

Image data (digital data) of the read color separation film is written in frame memory 16 through interface circuit 14. Interface circuit 14 has interface (I/F) 18 and selector 20. Interface circuit 14 supplies a start pulse to image scanner 12, and image scanner 12 supplies a clock pulse to interface circuit 14.

Frame memory 16 comprises four memories for respectively storing image data of four plates, i.e., Y, M, C, and K plates, and each memory has a capacity corresponding to $1,536 \times 1,200$ (pixels)$\times 8$ bits$=1,843$ MB. During a readout operation, horizontal frequency fM is set at 24.83 MHz, and clock frequency fCLK is set at about 20 MHz.

Selector 20 of interface circuit 14 has output terminals for four colors connected to these four memories, and outputs signals from I/F 18 from the output terminals of colors designated by color selection switch 22. Color selection switch 22 selects the color of a color separation film read by image scanner 12.

Timing generator 24 is connected to frame memory 16. Frame memory 16 receives an address signal, a read/write mode signal, and a zoom signal therefrom. The zoom signal is a signal for enlarging an image during a readout operation, and is set to have one of magnifications x1, x3, x6, and x12 by magnification selection switch 26.

Figure 1B:
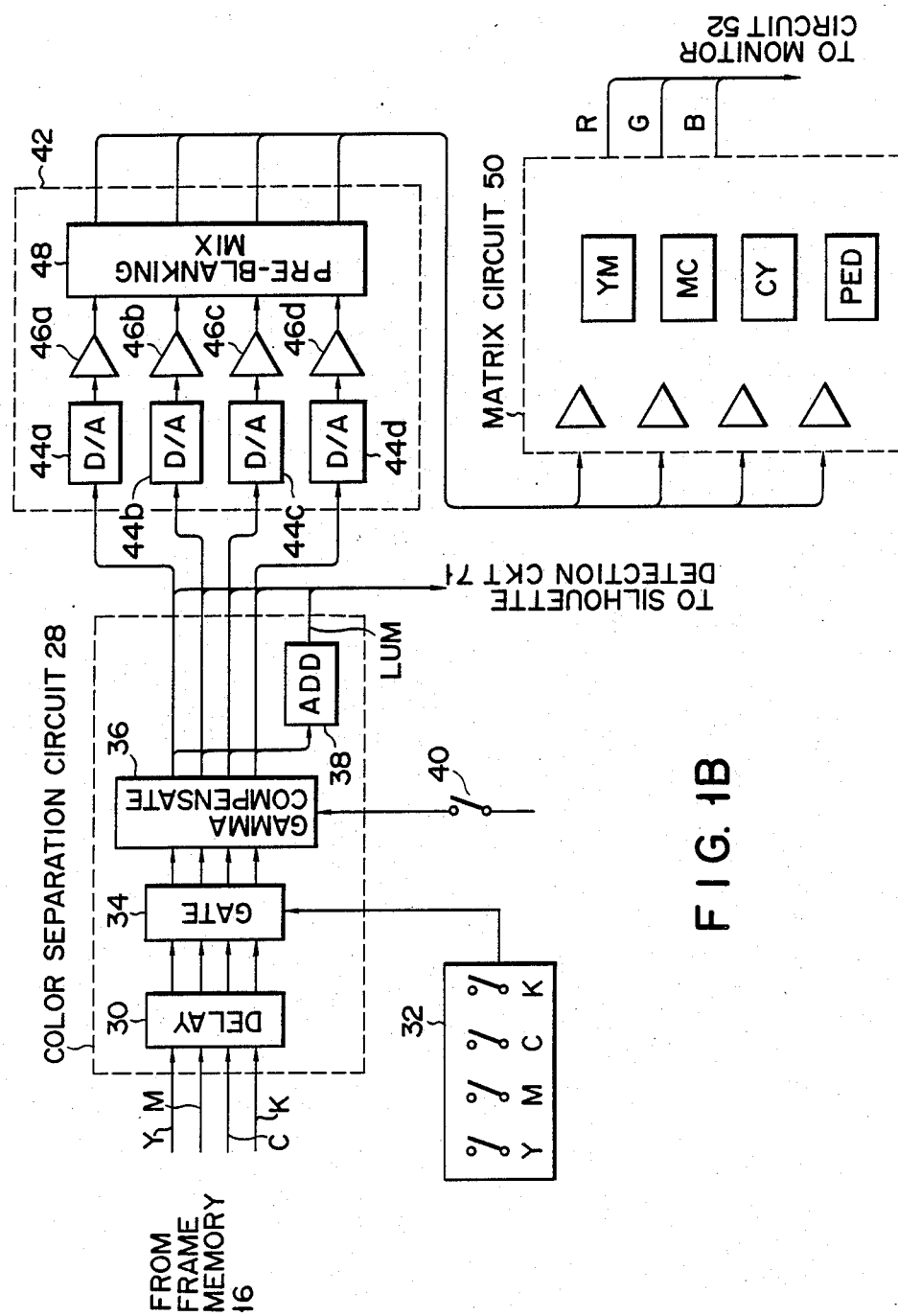

The Y, M, C, and K image signals are simultaneously read out from frame memory 16, and are input to color separation circuit 28 (FIG. 1B). Color separation circuit 28 designates a color used for silhouette detection in accordance with colors of a figure of an original since color components having highest contrast differ depending on colors of figures to be detected. When a sum of detection results of a plurality of colors is to be calculated, another color is sequentially selected after one color is detected.

Color separation circuit 28 comprises delay 30, gate 34 for selecting an arbitrary color of Y, M, C, and K in response to a selection signal from color selection switch 32, gamma compensate circuit 36, and adder 38 connected to Y, M, C, and K signal lines. Gamma compensate circuit 36 enables/disables gamma compensation in response to ON/OFF of switch 40.

Thus, gate 34 outputs an arbitrary color signal of Y, M, C, and K, which is selected by color selection switch 32, and is used for silhouette detection. The selected color signal will be referred to as a chroma-key signal hereinafter.

Adder 38 adds all the Y, M, C, and K color signals in a state wherein color selection switch 32 selects all the colors, and obtains a signal corresponding to a luminance. This signal is also used for silhouette detection, and will be referred to as a luminance-key signal hereinafter.

According to this embodiment, a silhouette can be detected in accordance with a difference in color or luminance. When the silhouette is detected based on a difference in color, differences for a plurality of colors can be also detected.

The chroma-key signal and the luminance-key signal are supplied to silhouette detection circuit 71 (to be described later).

The chroma-key signal of the outputs from color separation circuit 28 is input to D/A converter circuit 42. D/A converter circuit 42 has D/A converters 44a to 44d, and amplifier 46a to 46d which are arranged in correspondence with Y, M, C, and K signals, and preblanking signal mix circuit 48.

Output signals Y, M, C, and K from D/A converter circuit 42 are supplied to monitor circuit 52 through matrix circuit 50. Matrix circuit 50 has an amplifier, a secondary color correction circuit (YM circuit, MC circuit, and CY circuit), and a pedestal circuit. Circuit 50 converts the Y, M, C, and K signals into R, G, and B signals so that colors of a displayed image are approximated to a printed image, and supplies the R, G, and B signals to adders 54a, 54b, and 54c in monitor circuit 52.

As shown in FIG. 1C, adders 54a, 54b, and 54c of monitor circuit 52 add the R, G, and B signals output from matrix circuit 50 and an output signal from data processing circuit 94 (to be described later). Key memory white level adjusting resistor 56 and key white level adjusting resistor 58 are connected to adders 54a, 54b, and 54c.

The outputs from adders 54a, 54b, and 54c are input to switching circuit 60. Overlap/chromatic-key display selection switch 62 and overlap/key memory display selection switch 64 are connected to switching circuit 60.

The outputs from switching circuit 60 are input to adders 66a, 66b, and 66c. Adders 66a, 66b, and 66c add the R, G, and B signals output from switching circuit 60 and cross-marker, mask, and enlargement-frame signals from CPU 120 (to be described later). The cross-marker signal is a signal for displaying a "+" mark at one point in a displayed image (a point in a silhouette to be detected for forming a mask). The enlargement-frame signal indicates a frame used when an image in frame memory 16 is enlarged. The mask signal represents an arbitrary figure in the displayed image drawn by digitizer 134 and is used for amending the data stored in key memory 48.

The R, G, and B signals from adders 66a, 66b, and 66c are supplied to CRT display 70 through amplifiers 68a, 68b, and 68c, and are displayed thereon with the cross mark. For this reason, the image of the arbitrary color separation film designated by selection switch 32 is displayed. Usually, Y, M, C, and K images are all displayed. The resolution of CRT display 70 is 640×400 (pixels).

Figure 1D:
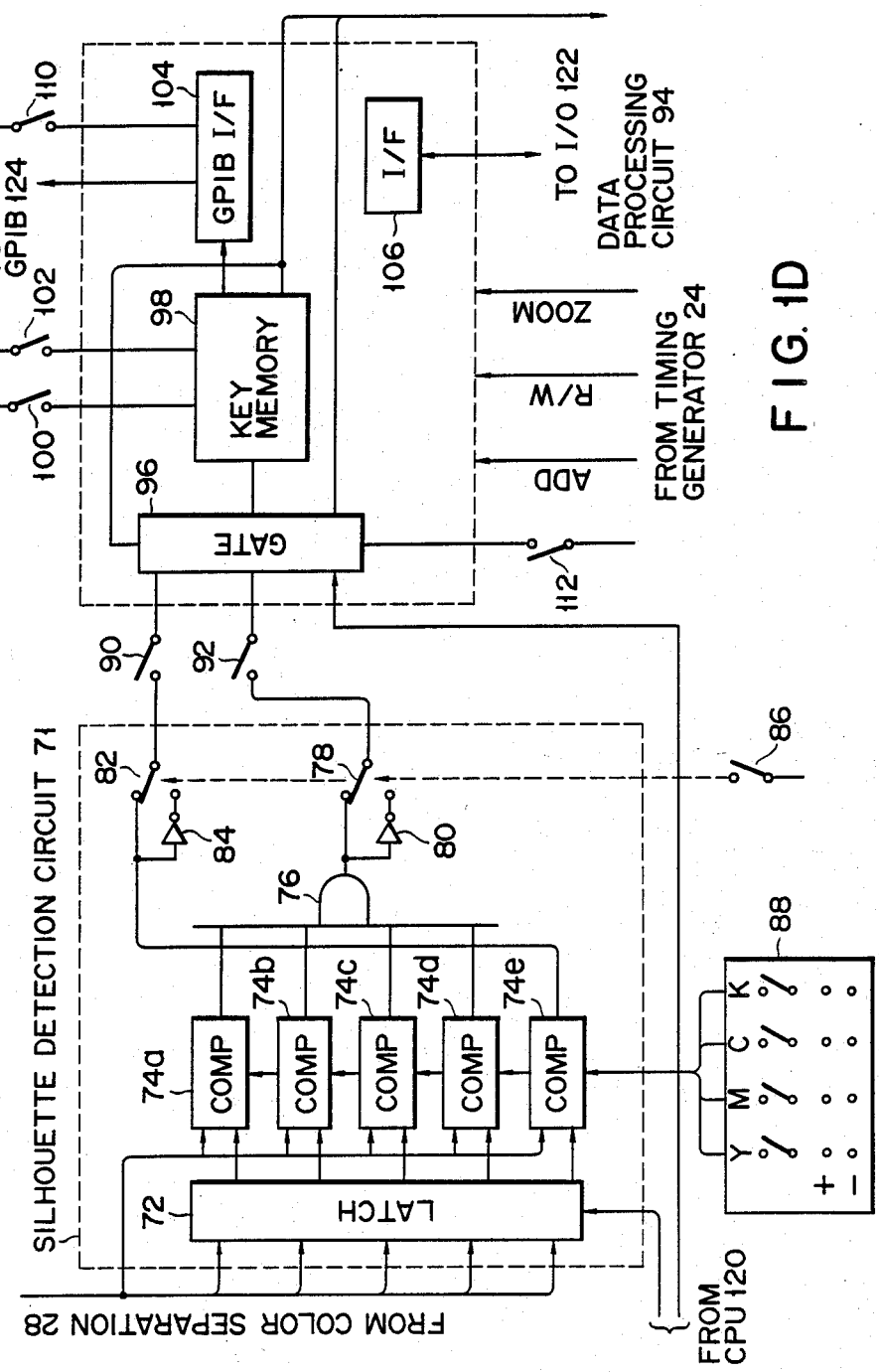

As shown in FIG. 1D, the Y, M, C, and K chromakey signals and the luminance-key signal output from color separation circuit 28 are supplied to silhouette detection circuit 71, and cross-marker pixel data is latched by latch 72. A latch pulse for determining a latch timing is supplied from CPU 120 in accordance with the position of the cross mark.

The Y, M, C, and K chroma-key signals and the luminance-key signal output from latch 72 are supplied to the first input terminals of comparators 74a, 74b, 74c, 74d, and 74e. The second input terminals of comparators 74a to 74e receive real-time Y, M, C, and K chroma-key signals and the luminance-key signal output from color separation circuit 28. Comparators 74a to 74e receive the output from level setter 88. When a difference between first and second input signals is lower than the output from lever setter 88, each comparator outputs an "H"-level detection signal. More specifically, a point having a small difference in color or brightness from the cross-marker point is detected as a necessary portion. Level setter 88 can select Y, M, C, and K and set levels in units of Y, M, C, and K colors, and the K level is also used for a set level for luminance-key.

The outputs from comparators 74a to 74d are supplied to the first input terminal of selector 78 through AND gate 76. If plural colors are selected by level setter 88, the chroma-key is produced in the form of a combination of the plural colors. The output from AND gate 76 is supplied to the second input terminal of selector 78 through inverter 80. The output from comparator 74e is directly input to the first input terminal of selector 82, and is also supplied to the second input terminal of selector 82 through inverter 84. Selectors 78 and 82 are switched by key white/black selection switch 86. Key white/black selection switch 86 is a switch for switching whether a portion inside or outside the necessary portion is to be detected, and is switched in accordance with the arrangement of an output section for forming a mask.

The outputs from selectors 82 and 78 are supplied to gate 96 in data processing circuit 94 respectively through luminance switch 90 and chroma switch 92. One of luminance and chroma switches 90 and 92 is turned on. Gate 96 also receives a draw/mask signal from CPU 120. Addition/subtraction switch 112 is connected to gate 96.

The key signal (chroma-key or luminance-key signal) output from gate 96 is written in key memory 98. Key memory 98 stores a silhouette image of the necessary portion. Freeze switch 100 and clear switch 102 are connected to key memory 98. Freeze switch 100 is used to write the output key signal from gate 96 into key memory 98. Clear switch 102 is a switch for clearing data in key memory 98. The output from key memory 98 is supplied to GPIB 124 through GPIB I/F 104. Transmission switch 110 is connected to GPIB I/F 104. Data processing circuit 94 has I/F 106 connected to I/O 122 of CPU 120.

The output signal from key memory 98 (to be referred to as a key memory signal hereinafter) is fed back to key memory 98 through gate 96. The feedback signal is added to or subtracted from the key memory signal at gate 96 in accordance with on/off of add/subtraction switch 112. This function is used in a case wherein a detection result by another color of the chroma-key signal is superposed when detection cannot be performed using a chroma-key signal of only one color.

Key memory 98 receives the address signal, read/write selection signal, and zoom signal from timing generator 23 (FIG. 1A).

The key signal output from gate 96 and the key memory signal output from key memory 98 are supplied to adders 54a, 54b, and 54c of monitor circuit 52. Thus, CRT display 70 displays an image of the corresponding color separation film on which a silhouette image is superposed, and the result of silhouette detection can be confirmed on the display screen. More specifically, an image inside or outside the silhouette is displayed at a low density. Variable resistors 56 and 58 are arranged to adjust the density.

Position of the cross mark, set levels for comparators 74a to 74e, color selection of the chroma-key signal, and selection of chromatic key and luminance key as parameters for silhouette detection can be arbitrary changed by an operator. Thus, when a detection result is not suitable, these parameters are adjusted while observing the detection result on the display screen, thus finally allowing accurate silhouette detection.

Upon completion of silhouette detection, data processing circuit 94 sends data in key memory 98 to CPU 120 through GPIB I/F 104.

Figure 1E:
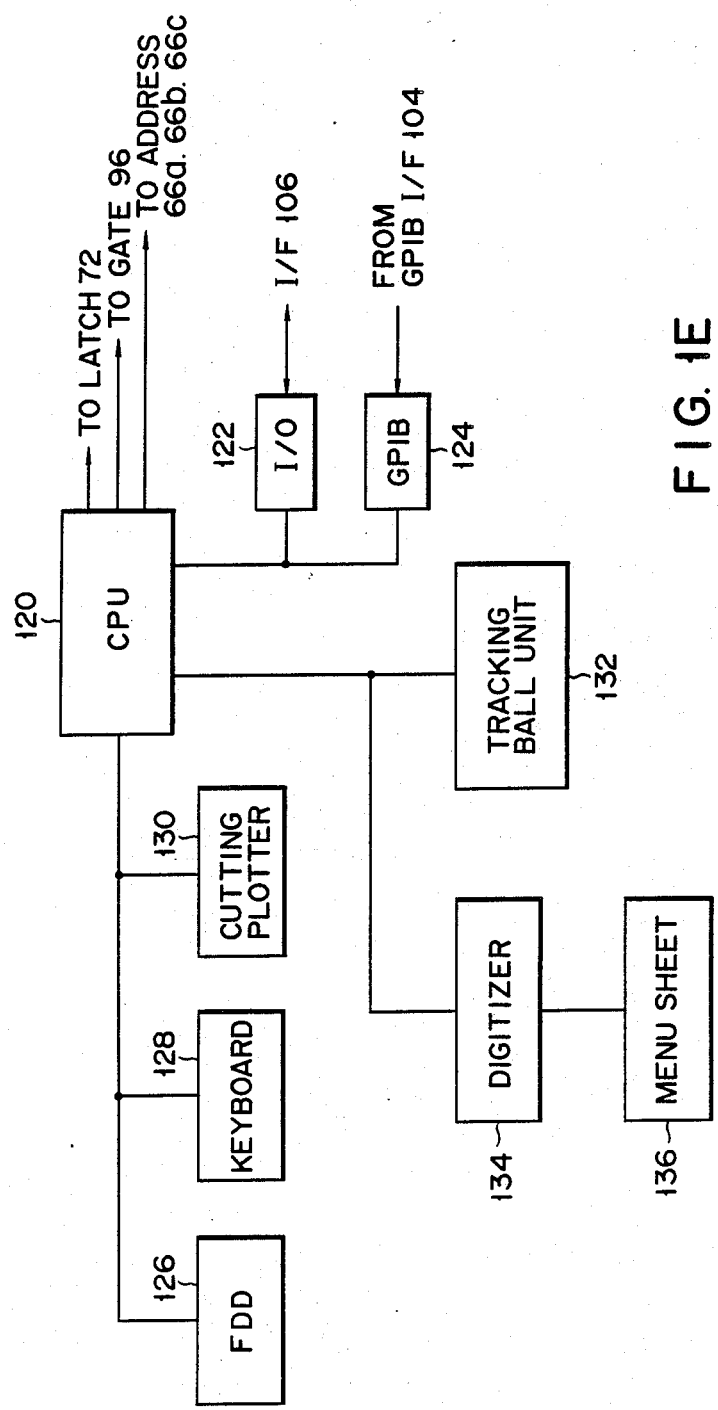

As shown in FIG. 1E, CPU 120 is connected to I/O 122, GPIB 124, floppy disk unit (FDD) 126, keyboard 128, cutting plotter 130, tracking ball unit 132, digitizer 134, and menu sheet 136. Keyboard 128 is used to control CPU 120. Cutting plotter 130 is an output section for cutting a peel-off film in accordance with the key memory signal supplied through GPIB 124. In practice, since the key memory signal is a silhouette signal (raster data), CPU 120 converts the key memory signal into vector data, smooths the vector data, and supplies the smoothed data to cutting plotter 130. If a silhouette is detected to be slightly larger, an unnecessary line, e.g., a white line appears outside the image, resulting in poor appearance. Thus, the detected silhouette is corrected to be slightly smaller.

Digitizer 134 is used to manually input silhouette data when silhouette data cannot be automatically detected and also to designate the position of cross mark.

Note that the output section may be one for exposing only a portion of a positive film inside the necessary portion so as to be transparent after development.

A press plate is formed from the color separation film using the mask obtained as described above, so that a desired figure of an original can be printed.

Figure 2:
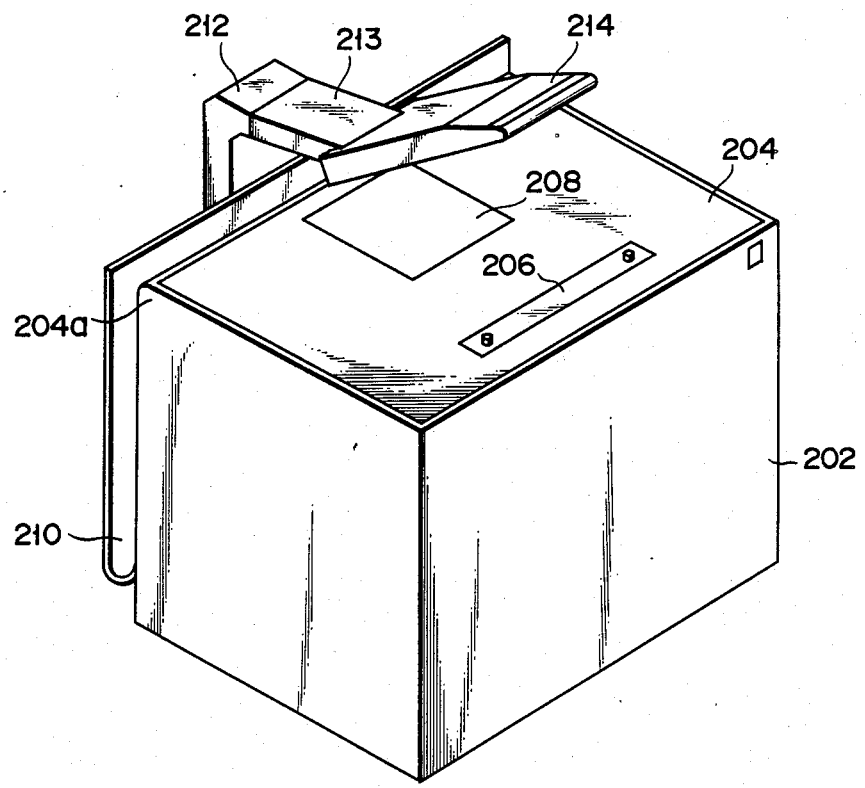
FIG. 2 is a view showing an outer appearance of a two-dimensional image sensor shown in FIG. 1A.

FIG. 2 shows an outer appearance of two-dimensional image scanner 12. Magnet sheet 204 is adhered on the upper surface of rectangular parallelepiped housing 202. Magnet sheet 204 is magnetized so as to fix register pins 206 for registering the position of the assmble film as an original for four plates. Note that when an original which does not require registration is used, the upper surface can be a simple glass. The surface of the housing has a size of 920 mm (length)×1,000 mm (width).

A transparent member such as glass is fitted in a portion of magnet sheet 204, thus forming pickup window 208. Pickup window 208 has a size of 155 mm (length) and 130 mm (width). Pickup window 208 is preferably located at the central position in the width direction and at an end portion in the length direction. The center of rectangle of pickup window 208 is located at a position 600 mm from the front side surface. A line sensor such as a CCD is arranged below pickup window 208. The line sensor is moved in a direction perpendicular to the array direction to two-dimensionally scan the portion of pickup window 208. The line sensor consists of 2,048 elements. When the size of pickup window 208 is enlarged, the capacity of frame memory 16 is correspondingly increased. It is possible to form frame memory 16 by a hard disk memory. In this case, buffer memory formed of a semiconductor memory is connected to the output terminal of interface circuit 14.

Gap portion 210 having two open sides and a substantially U-shaped section is formed on rear side surface of housing 202 near pickup window 208. Gap portion 210 is formed contiguous with the rear end of original table 204, and rear end 204a of original table 204 is rounded. The interval of gap portion 210 is 70 to 80 mm.

Arm 212 stands upright outside gap portion 210. Light source 214 is supported on arm 212 through movable arm 213. Light source 214 illuminates pickup window 208 of housing 202. Light source 214 comprises a linear fluorescent lamp parallel to the line sensor. The fluorescent lamp is also moved upon movement of the line sensor. A plurality of fluorescent lamps may be arranged in a moving range of the line sensor.

According to the two-dimensional image scanner with the above arrangement, when the original is larger than the upper surface of the housing, the original extending from the upper surface toward support arm 212 of light source 214 can be housed in gap portion 210. Since the rear end of the original table is rounded, the original portion housed in gap portion 210 can be prevented from being bent. Thus, the original can be desirably located on the upper surface of the housing without being interfered with by the support arm. For this reason, the central portion of a large-size original such as the assemble film can be located on pickup window 208. In this embodiment, the assemble original corresponding to a B2 size can be read.

Note that gap portion 210 may be formed by notching the housing itself along the rear side surface in the vertical direction in place of being attached to outside the housing 202.

According to this embodiment as described above, image information of a color separation film is sensed by an image scanner and is displayed on a color monitor, and a point in a desired figure and brightness or color difference inside or outside a necessary portion are designated so as to detect an image portion to be masked of the desired figure. In accordance with the detection result, the peel-off film is cut or a film is exposed to form a mask. As a result, accurate masking of a color separation film can be achieved within a short period of time.

What is claimed is:

1. A silhouette cutting apparatus comprising:
   input means for reading a separation film to obtain image information thereof;
   display means for displaying the image information obtained by said input means;
   means for designating a point in a desired figure of the displayed image;
   detection means for comparing one of brightness and color of the designated point and that of other points of the displayed image so as to detect points of a boundary where their difference exceeds a predetermined value, thereby detecting silhouette image information of the desired image; and
   an output section for forming a mask in accordance with the detected silhouette image information.

2. An apparatus according to claim 1, in which said detection means comprises:
   a frame memory for storing the displayed image;
   a circuit for obtaining chroma-key signals indicating colors of Y, M, C, and K plates and a luminance-key signal according to a luminance of the image signals from the output from said frame memory;
   a latch for latching one of the chroma-key signal of each color and the luminance-key signal at the designated point; and
   a comparator for obtaining one of a difference between the chroma-key signal of each color and chromakey signal at other points and a difference between the luminance-key signal latched by said latch and luminance-key signal at other points and detecting points of the boundary where the difference exceeds the predetermined value.

3. An apparatus according to claim 2, in which said detection means comprises a selector for selecting one of the chroma-key signal of each color and the luminance-key signal, a key memory for storing a detection result for the selected signal, and means for adding/subtracting the output from said key memory and the detection result for another selected signal and writing the sum/difference in said key memory.

4. An apparatus according to claim 1, in which said display means comprises means for superposing and displaying the detected silhouette image information on the image information of a separation film.

5. An apparatus according to claim 1, in which said input means comprises:
   a housing incorporating photoelectric conversion means;
   an original table arranged on an upper surface of said housing and having a transparent portion corresponding to at least said photoelectric conversion means;
   a light source supported above a portion corresponding to said photoelectric means on an upper portion of said housing; and
   a gap portion provided inside a coupling portion between said light source and said housing, for housing an original.

6. An apparatus according to claim 1, in which said input means comprises:
   a housing incorporating photoelectric conversion means;
   an original table arranged on an upper surface of said housing and having a transparent portion corresponding to at least said photoelectric conversion means;
   a gap portion, having two open ends, for housing an original; and
   a light source supported above a portion corresponding to said photoelectric conversion means on an upper portion of said housing through an arm provided outside said gap portion.

* * * * *